United States Patent
Ng et al.

(10) Patent No.: US 10,593,767 B2
(45) Date of Patent: Mar. 17, 2020

(54) FIELD PLATE STRUCTURE FOR POWER SEMICONDUCTOR DEVICE AND MANUFACTURING METHOD THEREOF

(71) Applicants: Chun Wai Ng, Hong Kong (CN);
Iftikhar Ahmed, Hong Kong (CN);
Johnny Kin On Sin, Hong Kong (CN)

(72) Inventors: Chun Wai Ng, Hong Kong (CN);
Iftikhar Ahmed, Hong Kong (CN);
Johnny Kin On Sin, Hong Kong (CN)

(*) Notice: Subject to any disclaimer, the term of this patent is extended or adjusted under 35 U.S.C. 154(b) by 183 days.

(21) Appl. No.: 14/771,095

(22) PCT Filed: Nov. 26, 2014

(86) PCT No.: PCT/CN2014/092250
§ 371 (c)(1),
(2) Date: Aug. 27, 2015

(87) PCT Pub. No.: WO2015/096581
PCT Pub. Date: Jul. 2, 2015

(65) Prior Publication Data
US 2016/0013279 A1     Jan. 14, 2016

(30) Foreign Application Priority Data

Dec. 23, 2013 (HK) .................. 13114187.9

(51) Int. Cl.
*H01L 29/40* (2006.01)
*H01L 29/78* (2006.01)
(Continued)

(52) U.S. Cl.
CPC ........ *H01L 29/405* (2013.01); *H01L 21/2855* (2013.01); *H01L 21/28525* (2013.01);
(Continued)

(58) Field of Classification Search
CPC ... H01L 29/73; H01L 29/405; H01L 29/1095; H01L 21/28525; H01L 21/2855;
(Continued)

(56) References Cited

U.S. PATENT DOCUMENTS 4,570,328 A * 2/1986 Price .................. H01L 21/318
148/DIG. 113
4,902,640 A * 2/1990 Sachitano ........... H01L 21/8249
148/DIG. 124

(Continued)

FOREIGN PATENT DOCUMENTS

CN          1038902      1/1990
CN        101930999    12/2010
(Continued)

OTHER PUBLICATIONS

Donald A. Neaman, Semiconductor Physics and Devices: Basic Principles, 2012, McGraw-Hill, Fourth Edition, p. 164.*
(Continued)

*Primary Examiner* — Jamie C Niesz
*Assistant Examiner* — Scott E Bauman
(74) *Attorney, Agent, or Firm* — Hamre, Schumann, Mueller & Larson, P.C.

(57) ABSTRACT

A structure and a manufacturing method of a power semiconductor device are provided. A structure of thin semi-insulating field plates (32, 33, 34) located between metal electrodes (21, 22, 23) at the surface of the power semiconductor device is provided. The thin semi-insulating field plates (32, 33, 34) are formed by depositing before metallization and annealing after the metallization. The present invention can be used in lateral power semiconductor devices and vertical power semiconductor devices.

15 Claims, 7 Drawing Sheets

(51) Int. Cl.
*H01L 29/739* (2006.01)
*H01L 29/06* (2006.01)
*H01L 29/732* (2006.01)
*H01L 29/45* (2006.01)
*H01L 29/66* (2006.01)
*H01L 29/861* (2006.01)
*H01L 21/285* (2006.01)
*H01L 29/73* (2006.01)
*H01L 29/74* (2006.01)
*H01L 29/10* (2006.01)

(52) U.S. Cl.
CPC .. *H01L 21/28556* (2013.01); *H01L 21/28568* (2013.01); *H01L 29/0619* (2013.01); *H01L 29/404* (2013.01); *H01L 29/456* (2013.01); *H01L 29/66136* (2013.01); *H01L 29/73* (2013.01); *H01L 29/732* (2013.01); *H01L 29/7393* (2013.01); *H01L 29/7395* (2013.01); *H01L 29/74* (2013.01); *H01L 29/7811* (2013.01); *H01L 29/7816* (2013.01); *H01L 29/7823* (2013.01); *H01L 29/7827* (2013.01); *H01L 29/8611* (2013.01); *H01L 29/1095* (2013.01)

(58) Field of Classification Search
CPC ......... H01L 21/28556; H01L 21/28568; H01L 29/0619; H01L 29/404; H01L 29/456; H01L 29/66136; H01L 29/732; H01L 29/7393; H01L 29/7395; H01L 29/74; H01L 29/7811; H01L 29/7816; H01L 29/7823; H01L 29/7827; H01L 29/8611; H01L 21/28518; H01L 21/324; H01L 21/28
USPC ....................................................... 257/488
See application file for complete search history.

(56) References Cited

U.S. PATENT DOCUMENTS

| | | | | |
|---|---|---|---|---|
| 5,089,872 A * | 2/1992 | Ozturk | ............... | H01L 21/28525 257/382 |
| 5,466,629 A * | 11/1995 | Mihara | ............. | H01L 27/10808 257/E21.009 |
| 5,731,603 A * | 3/1998 | Nakagawa | .......... | H01L 29/0696 257/140 |
| 6,255,703 B1 * | 7/2001 | Hause | ............... | H01L 21/28518 257/382 |
| 6,346,444 B1 * | 2/2002 | Park | ....................... | H01L 29/402 257/E21.358 |
| 6,399,512 B1 * | 6/2002 | Blosse | .............. | H01L 21/31116 216/38 |
| 6,455,892 B1 * | 9/2002 | Okuno | .............. | H01L 29/66068 257/328 |
| 7,161,194 B2 * | 1/2007 | Parikh | ................. | H01L 29/7787 257/194 |
| 7,420,201 B2 * | 9/2008 | Langdo | ............. | H01L 21/28518 257/18 |
| 7,504,704 B2 * | 3/2009 | Currie | ............... | H01L 21/76224 257/19 |
| 7,692,263 B2 * | 4/2010 | Wu | ..................... | H01L 29/2003 257/367 |
| 8,809,949 B2 * | 8/2014 | Schmidt | ................ | H01L 29/405 257/26 |
| 2002/0175371 A1 * | 11/2002 | Hause | .................... | H01L 29/665 257/344 |
| 2004/0082182 A1 * | 4/2004 | Blosse | ............. | H01L 21/31116 438/700 |
| 2005/0269660 A1 | 12/2005 | Singh | | |
| 2007/0210350 A1 * | 9/2007 | Omura | ................ | H01L 23/4824 257/287 |
| 2009/0194825 A1 * | 8/2009 | Werner | ............. | H01L 21/28123 257/397 |
| 2009/0267078 A1 * | 10/2009 | Mishra | ................ | H01L 29/2003 257/76 |
| 2010/0320535 A1 * | 12/2010 | Schmidt | ................ | H01L 29/872 257/335 |
| 2012/0276701 A1 * | 11/2012 | Yedinak | ................ | H01L 29/872 438/270 |
| 2013/0087808 A1 * | 4/2013 | Konstantinov | ....... | H01L 29/045 257/77 |

FOREIGN PATENT DOCUMENTS

| | | |
|---|---|---|
| CN | 101931006 | 12/2010 |
| CN | 102779764 | 11/2012 |

OTHER PUBLICATIONS

Marc J. Madou, Fundamentals of Microfabrication: The Science of Miniaturization, 2002, CRC Press LLC, 2nd Edition, p. 298-299.*
International Search Report and Written Opinion for International Application No. PCT/CN2014/092250, dated Feb. 27, 2015, 11 pgs. (English Translation of Search Report attached).

* cited by examiner

FIELD PLATE STRUCTURE FOR POWER SEMICONDUCTOR DEVICE AND MANUFACTURING METHOD THEREOF

BACKGROUND

Technical Field

The present invention generally relates to a structure and manufacturing of a power semiconductor device, and more particularly relates to a structure and manufacturing of a semi-insulating field plate.

Related Art

The present invention will be described in the structure of a power diode. However, it should be understood in the following description that, the present invention is equally applicable to the structures of other power semiconductor devices, such as metal oxide semiconductor field effect transistors (MOSFET), bipolar junction transistors (BJT), insulated gate bipolar transistors (IGBT) and thyristors.

Semi-insulating field plates have been widely used in power semiconductor device structures. The basic function of a semi-insulating field plate is to provide uniform electric field distribution below the plate in the off state of the device, and this contributes to improving the breakdown voltage of the power semiconductor device. However, the semi-insulating field plate usually requires patterning, which needs an additional etching step [1] which increases the manufacturing cost. The etching step may be skipped by depositing an amorphous silicon layer as a semi-insulating field plate before or after metallization. However, the deposition after metallization may pollute an electric furnace, and the deposition before metallization may cause the degradation of electrical performance due to the increased contact resistance between metal and silicon. Therefore, the target of the present invention is to provide a cost-effective semi-insulating field plate and a manufacturing method thereof without producing the problem of process compatibility or degradation of electrical performance.

PRIOR ART

FIG. 1 shows a semi-insulating field plate implemented in a lateral power diode structure in the prior art. As shown in the figure, the semi-insulating field plate is a semi-insulating polysilicon (SIPOS) layer (32) above a silicon oxide layer (31). The SIPOS layer (32) is manufactured by deposition before metallization. In the off state of a device, the current flows through the SIPOS layer (32) from a cathode (22) to an anode (21), so as to produce a linear voltage drop over the resistance of the SIPOS (32). The linear voltage drop will cause uniform electric field distribution on the surface of an n⁻ drift region (12). Uniform electric field distribution eliminates or reduces the peak electrical field near a p anode (11) and/or an n⁺ cathode (13), which contributes to improving the breakdown voltage of a diode. However, the manufacturing process of the structure needs to etch SIPOS to cut a contact hole for metal electrodes (21, 22) on the surface, and the etching process may cause extra manufacturing cost.

FIG. 2 shows another semi-insulating field plate implemented in a vertical power diode structure in the prior art. As shown in the figure, the semi-insulating field plate includes a silicon oxide layer (31) and a high resistivity amorphous silicon layer (33) on both metal electrodes (21, 23). The high resistivity amorphous silicon layer (33) is manufactured by deposition after metallization. In the off state of the device, the current flows through the amorphous silicon layer (33) from the external metal (23) to the anode metal (21) at the junction termination, thereby causing a linear voltage drop over the resistance of the amorphous silicon (33). The linear voltage drop may cause uniform electric field distribution at the surface of an n⁻ drift region (12) between a p anode (11) and a p field limiting ring (14), thereby contributing to the increase of the breakdown voltage of the diode at the junction termination. However, after the metal exists on the surface of the device wafer, the manufacturing of the amorphous silicon layer (33) needs a deposition step. In the deposition process, the metal may cause pollution to the electric furnace.

FIG. 3 shows yet another semi-insulating field plate implemented in the vertical power diode structure in the prior art. As shown in the figure, the semi-insulating field plate is a high resistivity amorphous silicon layer (33) above a silicon oxide layer (31) and below metal electrodes (21, 23). The high resistivity amorphous silicon layer (33) is manufactured by deposition before metallization. In the off state of the device, the current flows through the amorphous silicon layer (33) from the external metal (23) to the anode metal (21) at the junction termination, thus causing a linear voltage dropover the resistance of the amorphous silicon (33). The linear voltage drop may cause uniform electric field distribution on the surface of an n⁻ drift region (12) between a p anode (11) and a p field limiting ring (14), which is helpful for improving the breakdown voltage of the diode at the junction termination. However, the amorphous silicon (33) located between the anode electrode (21) and the p anode (11) can cause the increased contact resistance herein, which can cause the degradation of electrical performance. For example, the increased contact resistance will lead to the increased on-state voltage drop. For another example, if the same structure is implemented in the power MOSFET, the increased contact resistance will lead to the increased on resistance.

SUMMARY

Therefore, an objective of the present invention is to provide a cost-efficient semi-insulating field plate structure and a manufacturing method thereof without producing the problems of process compatibility or electrical performance degradation.

In order to achieve the objective and other objectives, the present invention provides a new semi-insulating field plate structure, the semi-insulating field plate structure comprises a thin semi-insulating layer (34) located between metal electrodes (21, 22/23) on the surface of a power semiconductor device.

Further, the semi-insulating layer (34) is any high resistivity material, including but not limited to, titanium nitride, polycrystalline silicon and amorphous silicon.

Further, the semi-insulating layer (34) is contacted by the metal electrodes (21, 22/23) on the side wall.

Further, the semi-insulating field plate structure is implemented in an LDMOS.

Further, the semi-insulating field plate structure is implemented in an LIGBT.

Further, the semi-insulating field plate structure is implemented in a vertical power MOSFET.

Further, the semi-insulating field plate structure is implemented in a power BJT.

Further, the semi-insulating field plate structure is implemented in an IGBT.

Further, the semi-insulating field plate structure is implemented in a thyristor.

A manufacturing method of a semi-insulating field plate structure comprises:

patterning the silicon oxide (31) that covers the silicon surface of a device wafer to form contact holes (41), depositing a thin semi-insulating layer (34) on the whole surface of the wafer, depositing and patterning metal electrodes (21, 22/23) on the thin semi-insulating layer (34), and annealing to make the metal electrodes (21, 22/23) to penetrate through the thin semi-insulating layer (34).

Further, the semi-insulating layer (34) is any high resistivity material, including but not limited to titanium nitride, polycrystalline silicon and amorphous silicon.

Further, the deposition method comprises chemical vapor deposition, low-pressure chemical vapor deposition, plasma enhanced chemical vapor deposition or sputtering.

DETAILED DESCRIPTION

Figure 1:
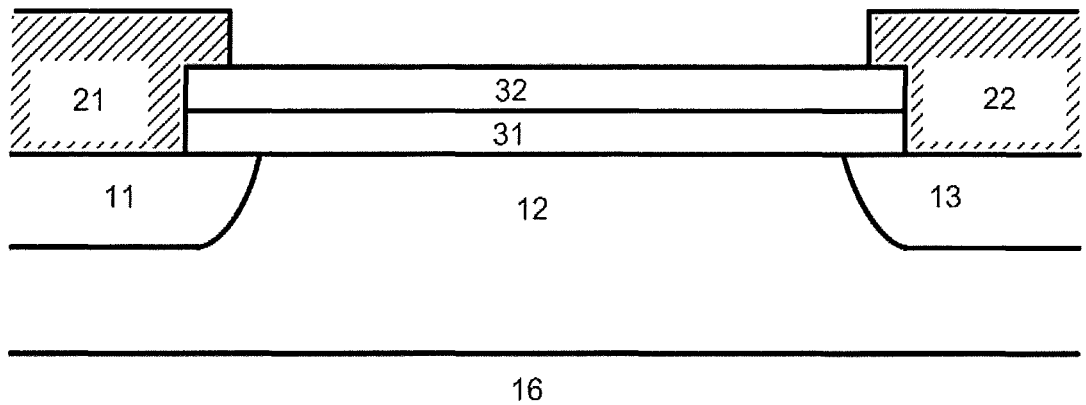
FIG. 1 is a cross section view of a SIPOS field plate structure implemented in a lateral power diode in the prior art.

FIG. 1 is a cross section view of an SIPOS field plate structure implemented in a lateral power diode in the prior art. The diode includes a p anode (11), an n$^-$ drift region (12) as well as an n$^+$ cathode (13) on a p substrate (16). The p anode (11) and the n$^+$ cathode (13) are contacted by an anode electrode (21) and a cathode electrode (22) respectively. The surface of an n$^-$ drift region (12) is covered by a silicon oxide layer (31). The silicon oxide layer (31) is covered by an SIPOS layer (32). The SIPOS layer is partially covered by the metal electrodes (21, 22). The manufacturing process of the SIPOS field plate (32) comprises: (1) depositing high resistivity polycrystalline silicon doped with silicon oxide or silicon nitride on the silicon oxide (31); (2) patterning the SIPOS (32) and the silicon oxide (31) by photolithography and etching; and (3) forming the metal electrodes (21, 22) by depositing and patterning.

Figure 2:
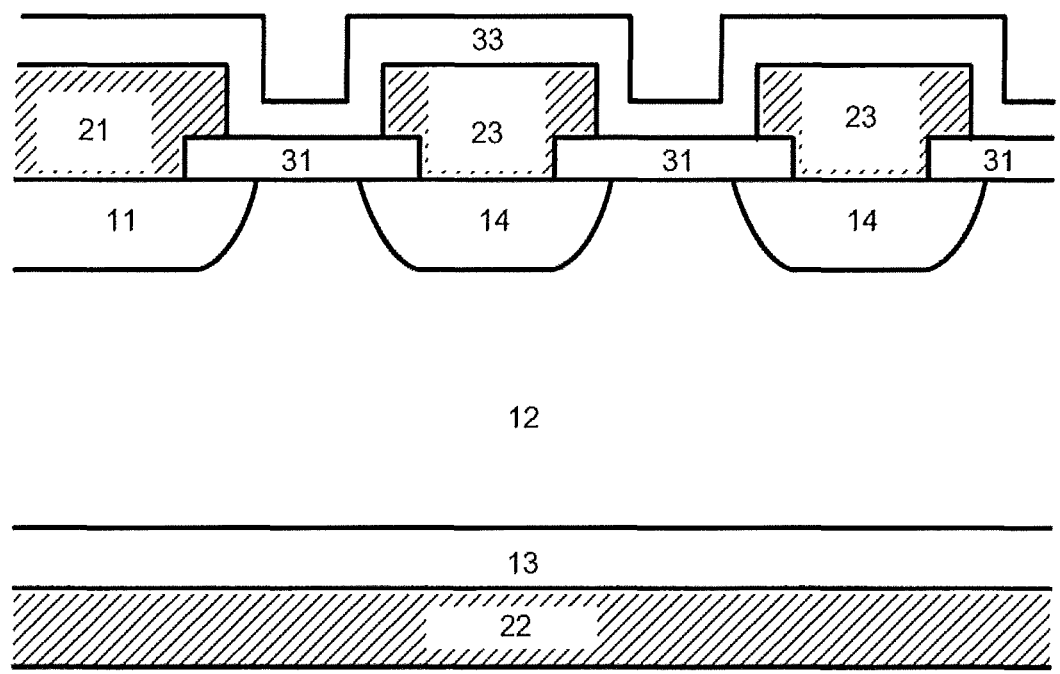
FIG. 2 is a cross section view of an amorphous silicon field plate implemented in a vertical power diode in the prior art.

FIG. 2 is a cross section view of an amorphous silicon field plate structure implemented in a vertical power diode in the prior art. The diode includes a p anode (11), an n$^-$ drift region (12), an n$^+$ cathode (13) and a plurality of p field limiting rings (14) at the junction termination. The n$^+$ cathode (13) is contacted by a cathode electrode (22) at the bottom of a wafer, and the p anode (11) and the p field limiting rings (14) are contacted by an anode electrode (21) on the surface of the wafer and an external metal (23) respectively. The n$^-$ drift region (12) and the surface of the p field limiting rings (14) are covered by a silicon oxide layer (31). The silicon oxide layer (31) is partially covered by the metal electrodes (21, 23). Both the silicon oxide layer (31) and the metal electrodes (21, 23) are covered by high resistivity amorphous silicon (33). The manufacturing process of the high resistivity amorphous silicon field plate (33) includes deposition of the thin amorphous silicon layer after the metal electrodes (21, 23) are formed.

Figure 3:
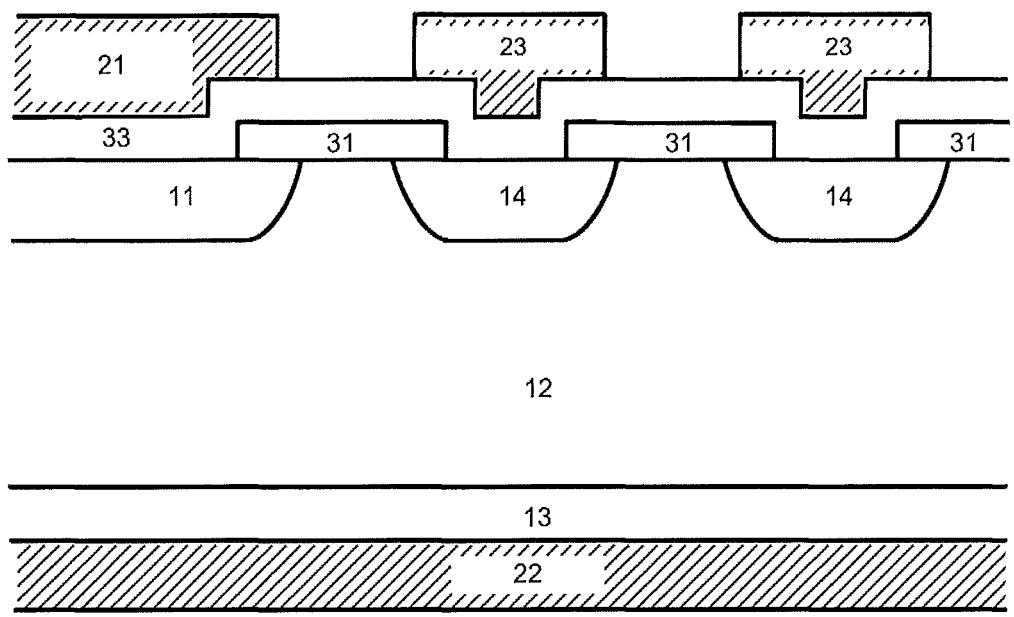
FIG. 3 is a cross section view of another amorphous silicon field plate implemented in the vertical power diode in the prior art.

FIG. 3 is a cross section view of another amorphous silicon field plate implemented in the vertical power diode in the prior art. The diode includes a p anode (11), an n$^-$ drift region (12), an n$^+$ cathode (13) and a plurality of p field limiting rings (14) at the junction termination. The n$^+$ cathode (13) is connected to a cathode electrode (22) through high resistivity amorphous silicon (33), and the p anode (11) and the p field limiting rings (14) are connected to an anode electrode (21) and an external metal (23) via the high resistivity amorphous silicon (33) respectively. The n$^-$ drift region (12) and the surface of the p field limiting rings (14) are covered by a silicon oxide layer (31), and the silicon oxide (31) is covered by the high resistivity amorphous silicon (33). The manufacturing process of the high resistivity amorphous silicon field plate (33) includes deposition of the thin amorphous silicon layer before the metal electrodes (21, 23) are formed.

Figure 4:
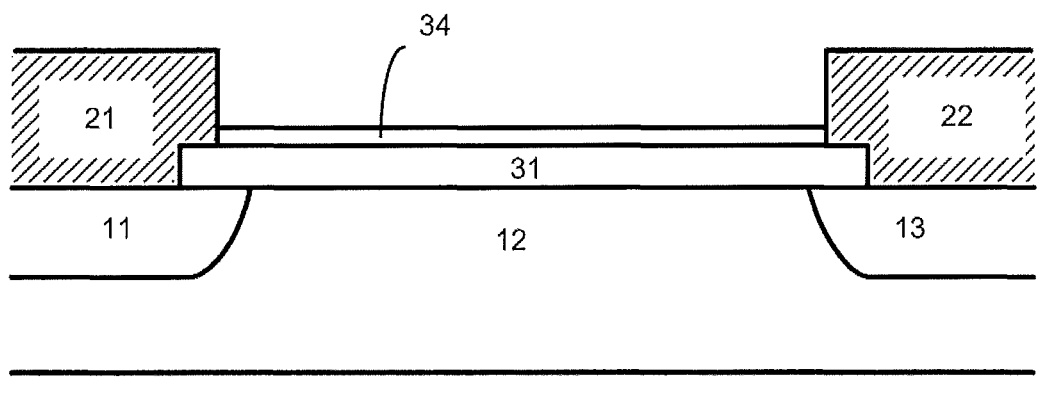
FIG. 4 is a cross section view of the present invention implemented in a lateral power diode.
Figure 5:
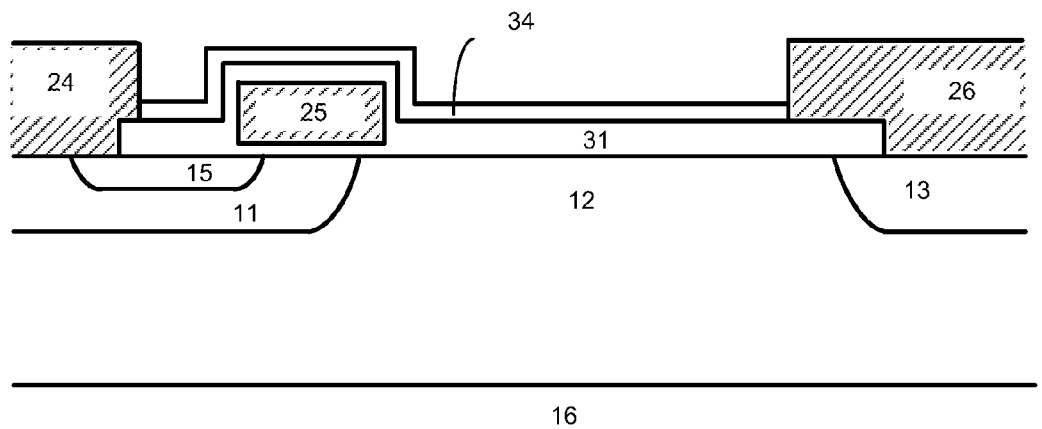
FIG. 5 is a cross section view of the present invention implemented in a lateral double diffused MOSFET (LDMOS).

FIG. 4 is a cross section view of the present invention implemented in a lateral power diode. The diode includes a p anode (11), an n$^-$ drift region (12) and an n$^+$ cathode (13). The P anode (11) and the n$^+$ cathode (13) are contacted by an anode electrode (21) and a cathode electrode (22) respectively. The surface of the n$^-$ drift region (12) is covered by a silicon oxide layer (31). The silicon oxide layer (31) is covered by a thin semi-insulating layer (34). The silicon oxide layer (31) is partially covered by the metal electrodes (21, 22). The semi-insulating layer (34) is located between the metal electrodes (21, 22) and is contacted by those electrodes on the side wall. The semi-insulating layer (34) may be any high resistivity material, including but not limited to, titanium nitride, polycrystalline silicon and amorphous silicon. The semi-insulating layer (34) has a thickness of about 5 nm to 100 nm and a resistivity of about 100 ohm-cm to 10,000 ohm-cm. In addition, it is worth pointing out that the same semi-insulating field plate structure is also applicable to other lateral power semiconductor devices, such as lateral double-diffused MOSFET (LDMOS) and lateral IGBT (LIGBT). FIG. 5 illustrates a cross section view of the present invention implemented in an LDMOS.

Figure 6:
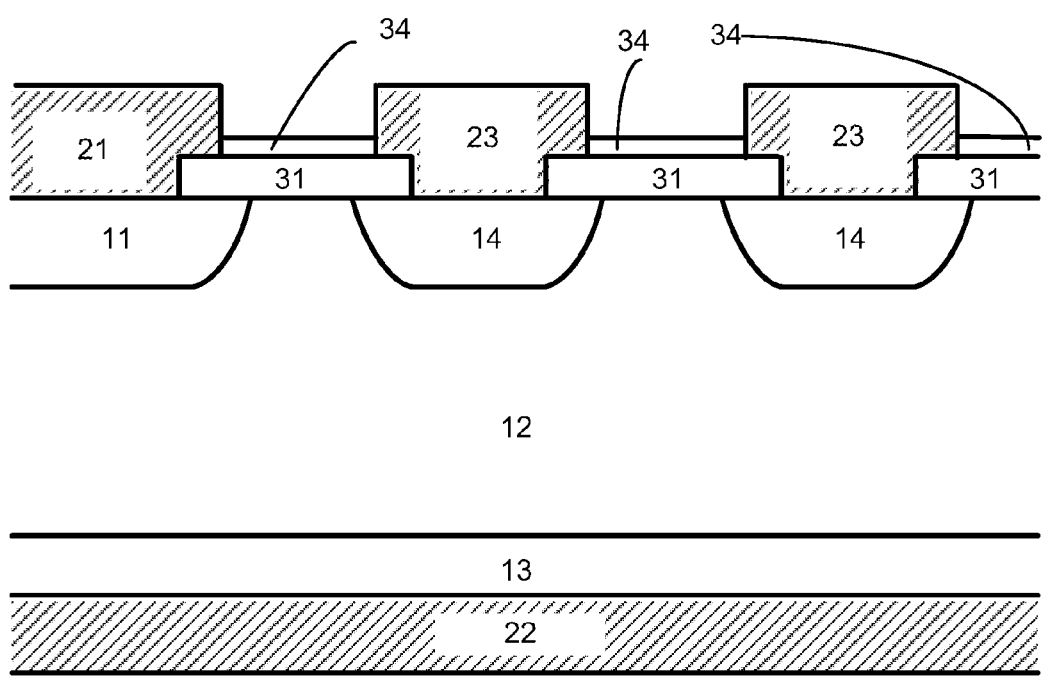
FIG. 6 is a cross section view of the present invention implemented in a vertical power diode.
Figure 7:
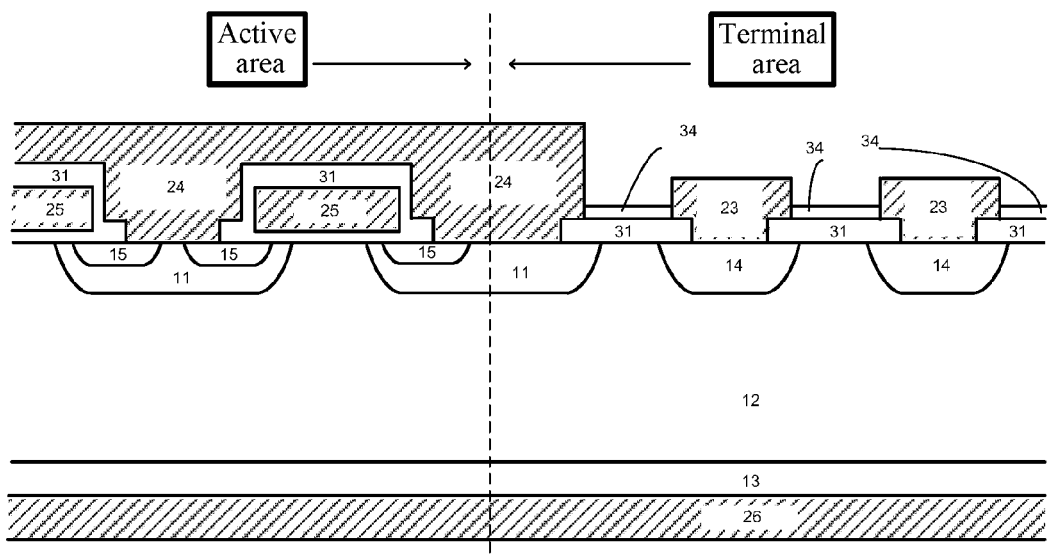
FIG. 7 is a cross section view of the present invention implemented in a vertical power MOSFET.
Figure 8:
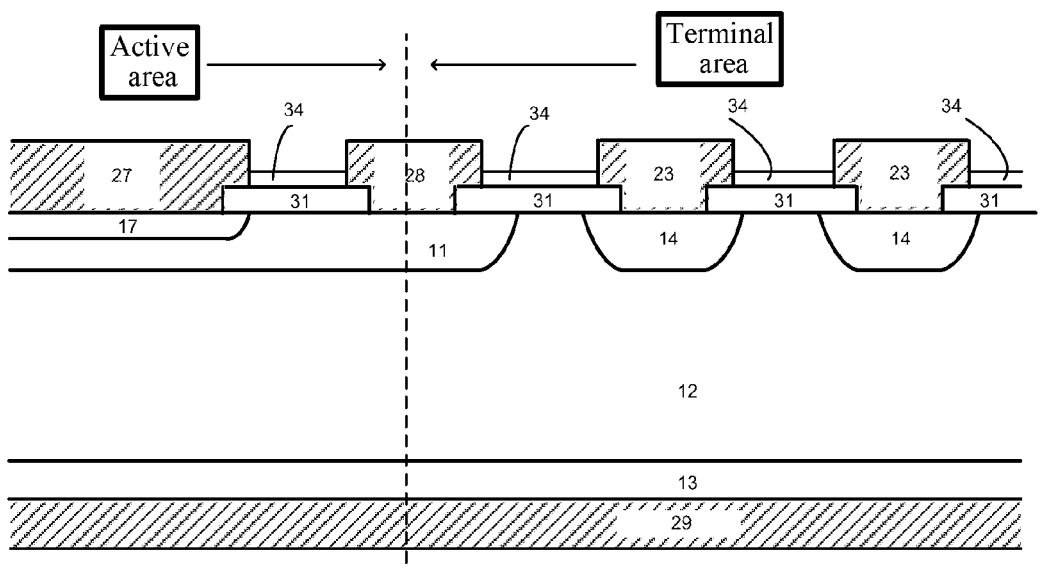
FIG. 8 is a cross section view of the present invention implemented in a vertical power BJT.

FIG. 6 is a cross section view of the present invention implemented in a vertical power diode. The diodes include a p anode (11), an n$^-$ drift region (12), an n$^+$ cathode (13) and a plurality of p field limiting rings (14) at a junction termination. The n$^+$ cathode (13) is contacted by a cathode electrode (22) at the bottom of a wafer, and the p anode (11) and the p field limiting rings (14) are contacted by an anode electrode (21) on the surface of the wafer and an external metal (23) respectively. The surfaces of the n$^-$ drift region (12) and the p field limiting rings (14) are covered by a silicon oxide layer (31). The silicon oxide layer (31) is covered by a thin semi-insulating layer (34). The silicon oxide layer (31) is also partially covered by metal electrodes (21, 23). The semi-insulating layer (34) is located between the metal electrodes (21, 22) and contacted by those electrodes on the side walls. The semi-insulating layer (34) can be any high resistivity material, including but not limited to, titanium nitride, polycrystalline silicon and amorphous silicon. The semi-insulating layer (34) has a thickness of about 5 nm to 100 nm and a resistivity of about 100 ohm-cm to 10,000 ohm-cm. In addition, it is worth pointing out that the same semi-insulating field plate structure is also applicable to other vertical power semiconductor devices, such as vertical power MOSFET, BJT, thyristors and IGBT. FIG. 7 illustrates a cross section view of the present invention implemented in the vertical power MOSFET. FIG. 8 illustrates a cross section view of the present invention implemented in the vertical power BJT.

Figure 9A:
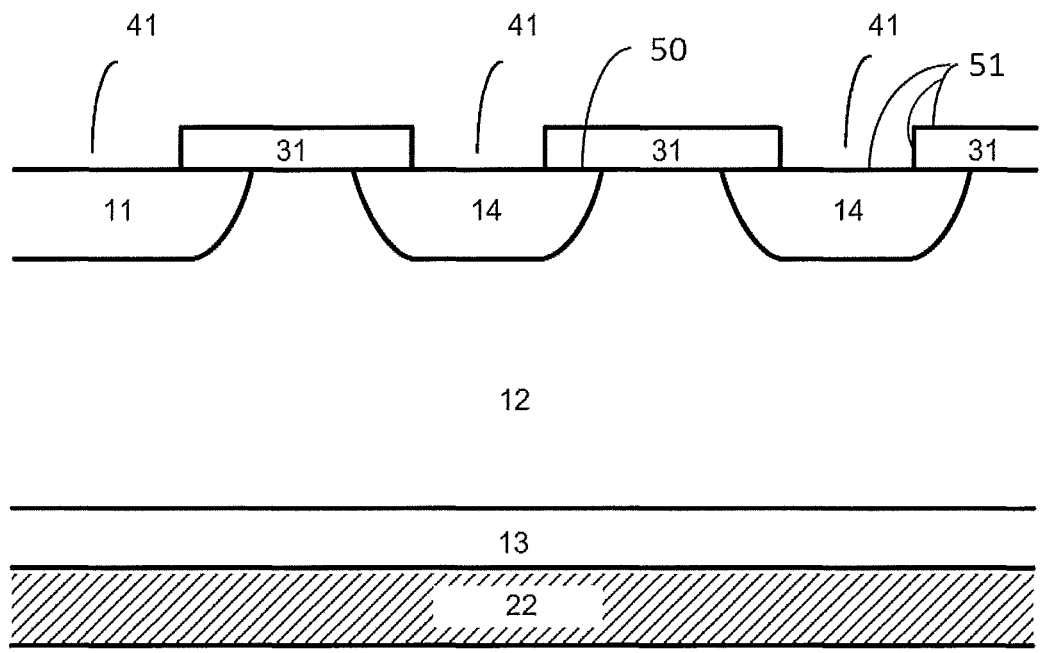
FIG. 9A to FIG. 9D illustrate critical manufacturing processes of an embodiment of the present invention as previously shown in FIG. 6.
Figure 9B:
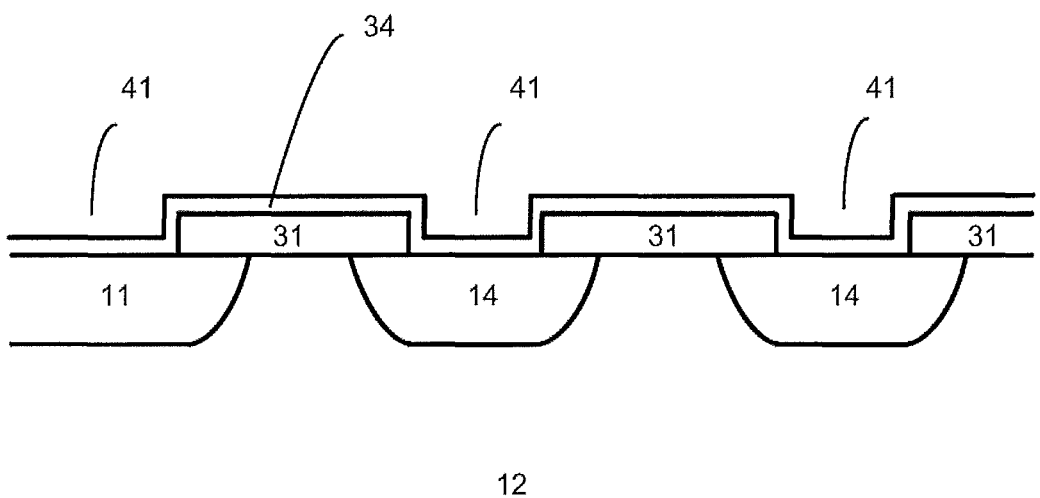
Figure 9C:
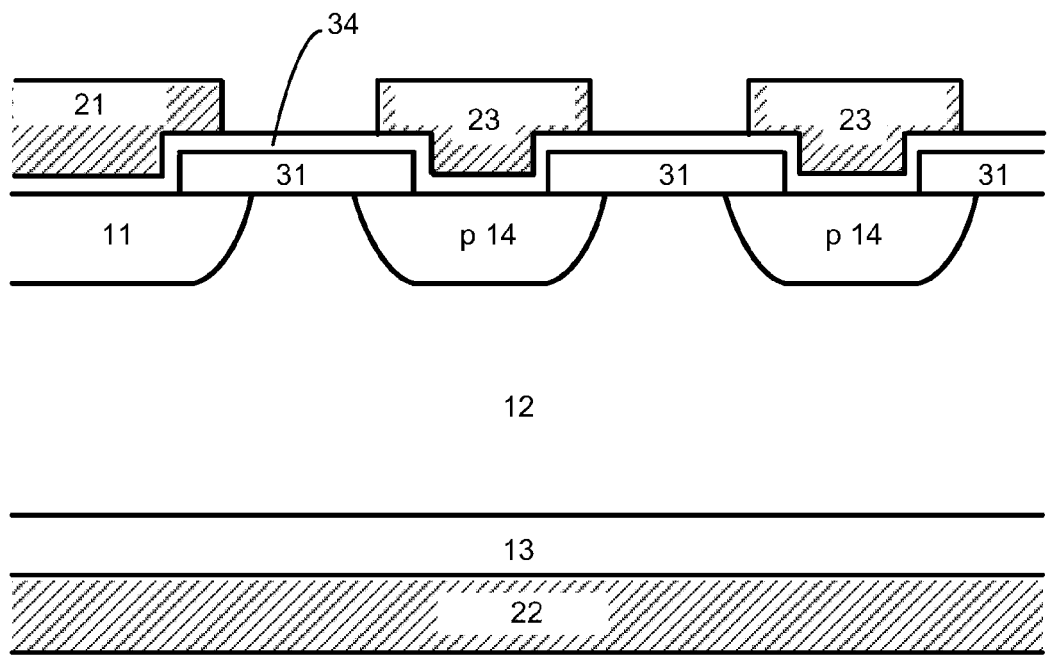
Figure 9D:
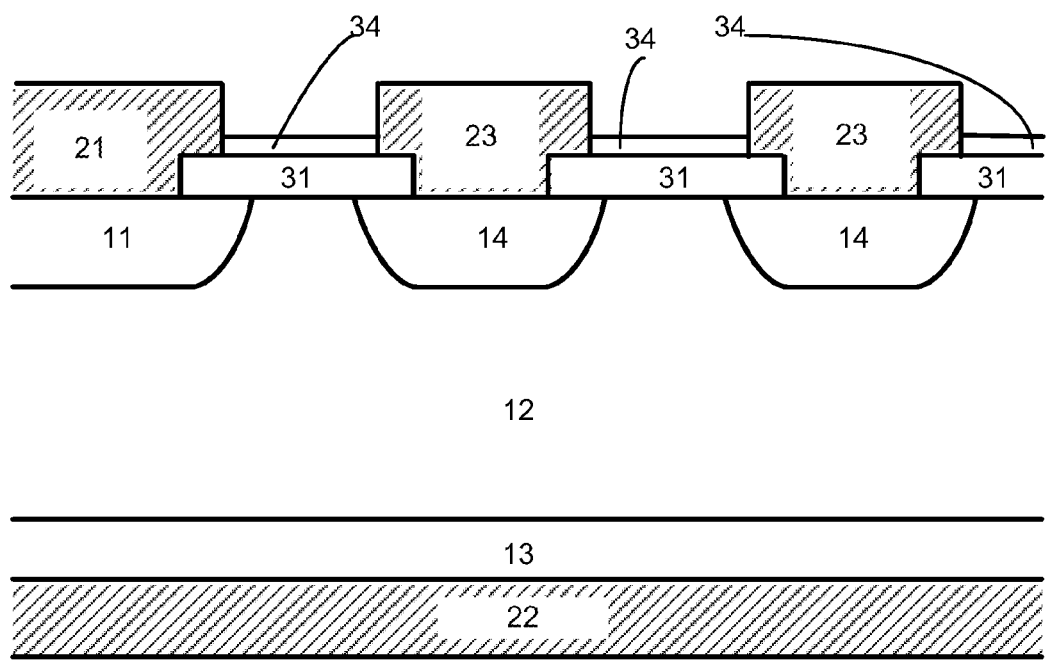

FIGS. 9A-9D illustrate critical manufacturing processes of an embodiment of the present invention as previously shown in FIG. 6. The manufacturing process of the structure include: (1) patterning the silicon oxide (31) that covers the silicon surface (50) of the wafer of the device to form contact holes (41), as shown in FIG. 9A; (2) depositing the thin semi-insulating layer (34) on the entire surface (51) of the wafer and the silicon oxide, as shown in FIG. 9 B; (3) depositing and patterning the metal electrodes (21, 23) on the thin semi-insulating layer (34), as shown in FIG. 9C; And (4) annealing to make the metal electrodes (21, 23) to penetrate through the thin semi-insulating layer (34), as shown in FIG. 9D.

FIG. 9A illustrates the formation of the contact holes (41). The contact holes (41) are generally formed by photolithography and etching.

FIG. 9B illustrates that the thin semi-insulating layer (34) is deposited on the silicon oxide (31). The semi-insulating layer (34) is also deposited in the contact holes (41) simultaneously. In the contact holes, the semi-insulating layer (34) covers the side wall of the silicon oxide (31) and the surface of silicon. The deposition can be chemical vapor deposition (CVD), low-pressure chemical vapor deposition, plasma enhanced chemical vapor deposition or sputtering. The semi-insulating layer (34) may be any high resistivity material, including but not limited to, titanium nitride, polycrystalline silicon and amorphous silicon. The semi-insulating layer (34) has a thickness of about 5 nm to 100 nm and a resistivity of about 100 ohm-cm to 10,000 ohm-cm.

FIG. 9C illustrates the formation of metal electrodes (21, 23). The metal electrodes (21, 23) are usually formed by deposition, photolithography and etching.

FIG. 9D illustrates the penetration of metal electrodes (21, 23). The penetration is realized by annealing the device wafer. The annealing temperature, duration and environment depend on the thickness and the material of the semi-insulating layer (34) and the material of the metal electrodes (21, 23) as well. For instance, when an SIPOS type semi-insulating layer (34) of about 10 nm and aluminum electrodes (21, 23) are adopted, the annealing needs about 30 minutes in H2 environment at 450 DEG C.

In addition, the manufacturing processes shown in FIG. 9A to FIG. 9D are applicable to the structure shown in FIG. 4. What's more, the same manufacturing processes are also applicable to other embodiments, for example, the embodiment of the present invention can be applied to other power semiconductor device structures of MOSFET, BJT, IGBT and thyristors.

Figure 10:
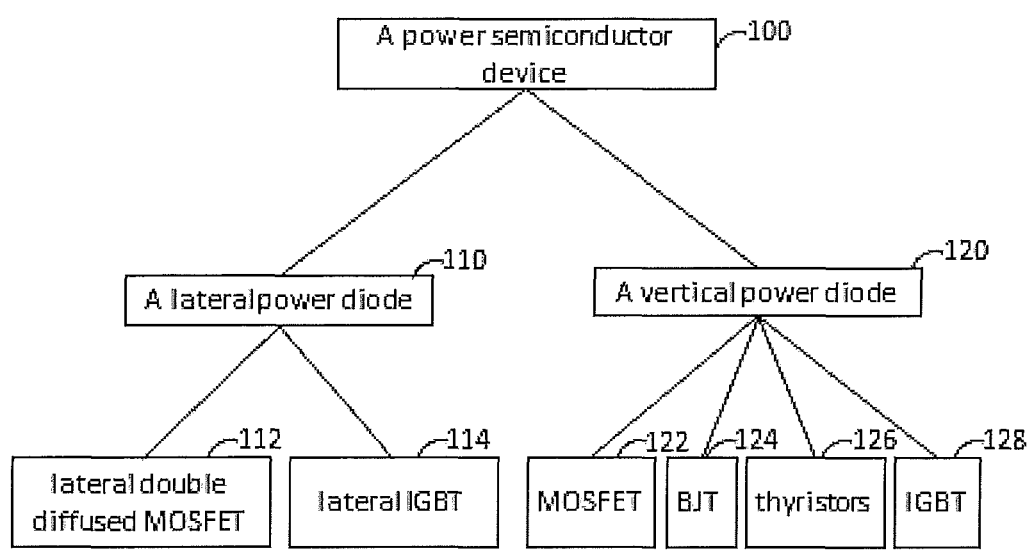
FIG. 10 illustrates examples of a power semiconductor device.

FIG. 10 illustrates examples of a power semiconductor device (100). The power semiconductor device (100) includes a semi-insulating plate structure that is embodied in FIGS. 4-8 and 9D. The power semiconductor device (100) can include but not limited to a lateral power diode (110) and a vertical power diode (120). The lateral power diode (110) can include but not limited to a lateral double disused MOSFET (112) (LDMOS) and a lateral IGBT (114) (LIGBT). The vertical power diode (120) can include but not limited to a MOSFET (122), a BJT (124), a thyristors (126) and an IGBT (128).

What is claimed is:

1. A semi-insulating field plate structure, comprising:
a semi-insulating layer on a silicon oxide layer and between metal electrodes on a surface of a power semiconductor device,
wherein the semi-insulating layer contains at least one resistivity material selected from titanium nitride and amorphous silicon,
the semi-insulating layer has a thickness of about 5 nm to 100 nm and a resistivity of about 100 ohm-cm to 10,000 ohm-cm, and
the semi-insulating layer and the silicon oxide layer are in direct contact with a side of each of the metal electrodes, wherein the side is where the metal electrodes face each other,
the metal electrodes directly overlap with the silicon oxide layer.

2. The semi-insulating field plate structure according to claim 1, wherein the semi-insulating layer is contacted by the metal electrodes on a side wall.

3. The semi-insulating field plate structure according to claim 1, wherein the power semiconductor device is an LDMOS.

4. The semi-insulating field plate structure according to claim 1, wherein the power semiconductor device is an LIGBT.

5. The semi-insulating field plate structure according to claim 1, wherein the power semiconductor device is a vertical power MOSFET.

6. The semi-insulating field plate structure according to claim 1, wherein the power semiconductor device is a power BJT.

7. The semi-insulating field plate structure according to claim 1, wherein the power semiconductor device is an IGBT.

8. The semi-insulating field plate structure according to claim 1, wherein the power semiconductor device is a thyristor.

9. The semi-insulating field plate structure according to claim 1, wherein the semi-insulating layer contains titanium nitride.

10. The semi-insulating field plate structure according to claim 1, wherein the metal electrodes are not overlapped with the semi-insulating layer when viewed from the thickness direction of the silicon oxide layer and the semi-insulating layer.

11. The semi-insulating field plate structure according to claim 1, wherein the semi-insulating layer and the silicon oxide layer are in direct contact with the side of each of the metal electrodes at the longitudinal direction of the semi-insulating layer and the silicon oxide layer, and
the metal electrodes directly overlap with the silicon oxide layer when viewed from the thickness direction of the silicon oxide layer and the semi-insulating layer.

12. A method for manufacturing a semi-insulating field plate structure, comprising:
patterning silicon oxide that directly covers a silicon surface of a device wafer to form contact holes;
depositing a thin semi-insulating layer directly on the entire surface of the wafer and the silicon oxide;

depositing and patterning metal electrodes directly on the thin semi-insulating layer; and annealing the metal electrodes and the thin semi-insulating layer, wherein the semi-insulating field plate structure include a semi-insulating layer on silicon oxide and between metal electrodes on a surface of a power semiconductor device, wherein the semi-insulating layer has a thickness of about 5 nm to 100 nm and a resistivity of about 100 ohm-cm to 10,000 ohm-cm.

13. The manufacturing method according to claim 12, wherein the semi-insulating layer contains at least one resistivity material selected from titanium nitride, polycrystalline silicon and amorphous silicon.

14. The manufacturing method according to claim 12, wherein the deposition method comprises chemical vapor deposition, low-pressure chemical vapor deposition, plasma enhanced chemical vapor deposition or sputtering.

15. A method for manufacturing a semi-insulating field plate structure, comprising:

patterning silicon oxide that directly covers a silicon surface of a side of a device wafer and forming contact holes;

depositing a thin semi-insulating layer on the entire surface of the side of the device wafer;

depositing and patterning metal electrodes directly on the thin semi-insulating layer and at the contact holes; and annealing the semi-insulating field plate structure, wherein semi-insulating field plate structure include a semi-insulating layer on silicon oxide and between metal electrodes on a surface of a power semiconductor device, wherein the semi-insulating layer contains titanium nitride.

* * * * *